United States Patent [19]

Stephens

[11] 4,313,023
[45] Jan. 26, 1982

[54] SOLAR CELL MODULE

[75] Inventor: Richard B. Stephens, Murray Hill, N.J.

[73] Assignee: Exxon Research & Engineering Co., Florham Park, N.J.

[21] Appl. No.: 163,727

[22] Filed: Jun. 27, 1980

Related U.S. Application Data

[63] Continuation-in-part of Ser. No. 15,931, Feb. 28, 1979, abandoned, which is a continuation-in-part of Ser. No. 920,795, Jun. 30, 1978, abandoned.

[51] Int. Cl.$^3$ ............................................. H01L 31/04
[52] U.S. Cl. .................................... 136/246; 136/251
[58] Field of Search ................................. 136/246, 251

[56] References Cited

U.S. PATENT DOCUMENTS

| | | | |
|---|---|---|---|
| 3,973,994 | 4/1976 | Redfield | 136/259 |
| 4,116,718 | 9/1978 | Yerkes et al. | 136/246 |
| 4,162,928 | 7/1979 | Shepard, Jr. | 136/246 |
| 4,235,643 | 11/1980 | Amick | 136/246 |

OTHER PUBLICATIONS

Solarex Corporation Data Sheet 6008-2, May 1978.

*Primary Examiner*—Aaron Weisstuch
*Attorney, Agent, or Firm*—Joseph J. Dvorak

[57] ABSTRACT

A solar cell module is provided in which a plurality of solar cells are linearly arrayed on a support structure, preferably in a close packed configuration. Adjacent the linearly arrayed cells is a lengthwise land area having facets with light reflective surfaces, the grooves defined by the facets running the length of the linearly arrayed cells. A light transparent optical medium couples the facets and the solar cells. Importantly the facet surfaces are angularly disposed at a predetermined angle such that solar radiation incident on the facet surface will be reflected upwardly into the optical medium where it will be internally reflected downwardly onto a solar cell thereby enhancing the output of the module.

11 Claims, 5 Drawing Figures

SOLAR CELL MODULE

CROSS-REFERENCE TO RELATED APPLICATION

This application is a continuation-in-part of Ser. No. 15,931, filed Feb. 28, 1979, and now abandoned, which in turn is a continuation-in-part of Ser. No. 920,795, filed June 30, 1978, abandoned.

FIELD OF THE INVENTION

This invention relates to a technique for enhancing the output of solar cell modules. More particularly, the present invention relates to an improved solar cell module designed to utilize light impinging on areas between the cells which would normally not be utilized in photoelectric conversion, thereby increasing the power output of the cell.

BACKGROUND OF THE INVENTION

A solar cell array comprises a plurality of individual cells and interconnector means for electrically connecting adjacent cells in a matrix. Typically, the individual solar cells are arranged in columns and rows and the interconnector means are positioned so as to connect the cells in the requisite series and/or parallel circuit arrangement. The circuit arrangement, of course, depends upon the desired output voltage and current at the module peak power point.

Generally, for terrestrial applications, a solar cell array is fabricated and sold as a module comprising the solar cell array mounted on an electrically nonconductive support member having terminals provided therein. The module also has a top cover over the solar cell array. This cover is a transparent protective coating which protects the solar cells against environmental hazards and also serves to maintain the cells in proper position. The module typically is fitted into a metal frame which provides mechanical strength for the array and protects the solar cell array against damage due to environmental loadings, such as from wind, snow, ice, rain, etc. The metal frame also serves as a means for mounting the module at the proper angle to receive insolation.

The individual solar cells used in forming a solar cell array for terrestrial applications are circular discs or wafers having diameters generally in the range of 2 to 4 inches and formed from a polycrystalline silicon ingot which is melted, and then reformed into a cylindrical ingot of single crystalline silicon. The discs or wafers are then cut from the cylindrical ingot. These circular cells are quite common in commercial use because they are relatively less expensive per unit area than cells having another geometry. When the circular cells are arrayed, however, the total active surface area of the array, i.e. of the solar cells, is less than the area required for mounting the array. Thus, not all the solar radiation which impinges on the module is utilized, since only some of the solar radiation impinges on active solar cell areas and some of the radiation impinges on inactive areas between the circular solar cells.

A number of techniques have been proposed for increasing the efficiency and effectiveness of solar cell modules by focusing incident solar radiation onto active cell areas. For example, mirrors and the like have been proposed to reflect solar radiation and concentrate the radiation in a given area. In this regard, see U.S. Pat. No. 3,990,914, wherein a tubular solar cell is described which is mounted in a parabolic mirror for concentration of solar radiation onto the solar cells. Also, mention should be made of U.S. Pat. No. 2,904,612 describing a reflector-type device in which the land areas between the circular solar cells consist essentially of inverted intersecting frustums of cones circumscribing the cells.

Another technique employed to enhance solar cell module output is the use of lenses. In U.S. Pat. No. 3,018,313, for example, a solar cell module is described which has an array of lenses covering the module so as to concentrate the light impinging on the cover of the solar cell array to converge downwardly toward the active solar cell area. In U.S. Pat No. 4,053,327, yet another light focusing arrangement is described wherein the cover of a solar cell module comprises a plurality of converging lenses arranged so as to direct the light incident on the module so that it does not fall on the grid lines of the front electrode of the solar cells in the array. Yet another optical system for focusing incident radiation onto the solar cells so as to increase electric output and increase the efficiency of operation of such modules is disclosed in U.S. Pat. No. 4,042,417.

In addition to reflecting solar insolation from inactive areas of solar cell modules to the active areas of solar cells, it has also been proposed to use reflective surfaces below very thin solar cells so that light which penetrates the active solar cell area without being absorbed can be reflected back again to the active layer. See, for example, U.S. Pat. No. 3,973,994.

In U.S. Pat. No. 4,116,718, there is disclosed a solar cell module having a light diffusive member covering part of the area of the module not covered by solar cells. The diffusive member scatters incident solar radiation, some of which scattered radiation is ultimately absorbed by a solar cell.

In U.S. Pat. No. 4,235,643, a solar cell module is disclosed in which faceted light reflective surfaces are provided in the land area surrounding a plurality of circular solar cells arrayed on a support and encapsulated in an optical medium. Light incident on the reflective surfaces is thereby directed upwardly through the encapsulant and then downwardly, by internal reflection, toward the active surface of a solar cell.

Notwithstanding the advantages made in the past in increasing the efficiency of solar cell modules, there still remains a very definite need for a solar cell module which will utilize all the light energy that is available as effectively and efficiently as possible and importantly without the necessity of complex, expensive and environmentally vulnerable optical systems.

SUMMARY OF THE INVENTION

Broadly speaking, an improved solar cell module comprises a plurality of linearly arrayed solar cells mounted on a support structure having a generally planar surface, each linear array having a linear land area on each of the lengthwise sides of the linear array and in which the land area has a plurality of facets with light reflective surfaces, each facet having a predetermined angular relationship with respect to the planar surface of the support and each other, so that the module can be positioned, in use, to have the reflective surfaces running in an east to west direction, thereby optimizing the amount of light impinging on the module over the course of a day which will be reflected upwardly through the optical cover medium and ultimately substantially back towards the semi-circular solar cells. Preferably the facets will comprise a plurality of V-shaped grooves which extend substantially the entire length of the linearly arrayed cells. In general, the geometry of the groove is such that light normal to the solar cell module will be reflected from the groove's surface to the top surface of the optical medium and that the angle of incidence of such reflected light at the top surface of the optical medium will be greater than the critical angle.

In another aspect of the present invention, the output of a solar cell module is increased by providing a plurality of linearly arrayed solar cells mounted on a planar support structure and encapsulated in a light transparent optical medium. The module is also provided with V-shaped, light reflective, grooves running lengthwise in the land areas between the cells; and the module is positioned so that the active solar cells are normal to the sun at solar noon and so that the grooves run in an east to west direction.

Advantages and other features of this invention will be apparent from the specification which follows and from the drawings, wherein like numerals are used throughout to identify like parts.

DETAILED DESCRIPTION OF THE INVENTION

In the practice of the present invention, a plurality of solar cells are arrayed on a generally planar support structure in linear fashion. The cells may be arrayed on the top of an electrically nonconductive plastic support structure similar to that described, for example, in U.S. Pat. No. 4,132,570, or the cells can be arrayed on the underside of a light transparent support structure such as a sheet of glass.

The shape of the cells preferably is semicircular since that configuration presently allows maximum packing density at least cost; however, other cell shapes, such as squares, ribbons and the like may be employed, particularly where cost considerations are not important. For convenience, reference is nonetheless made herein to semicircular cells.

Figure 1:
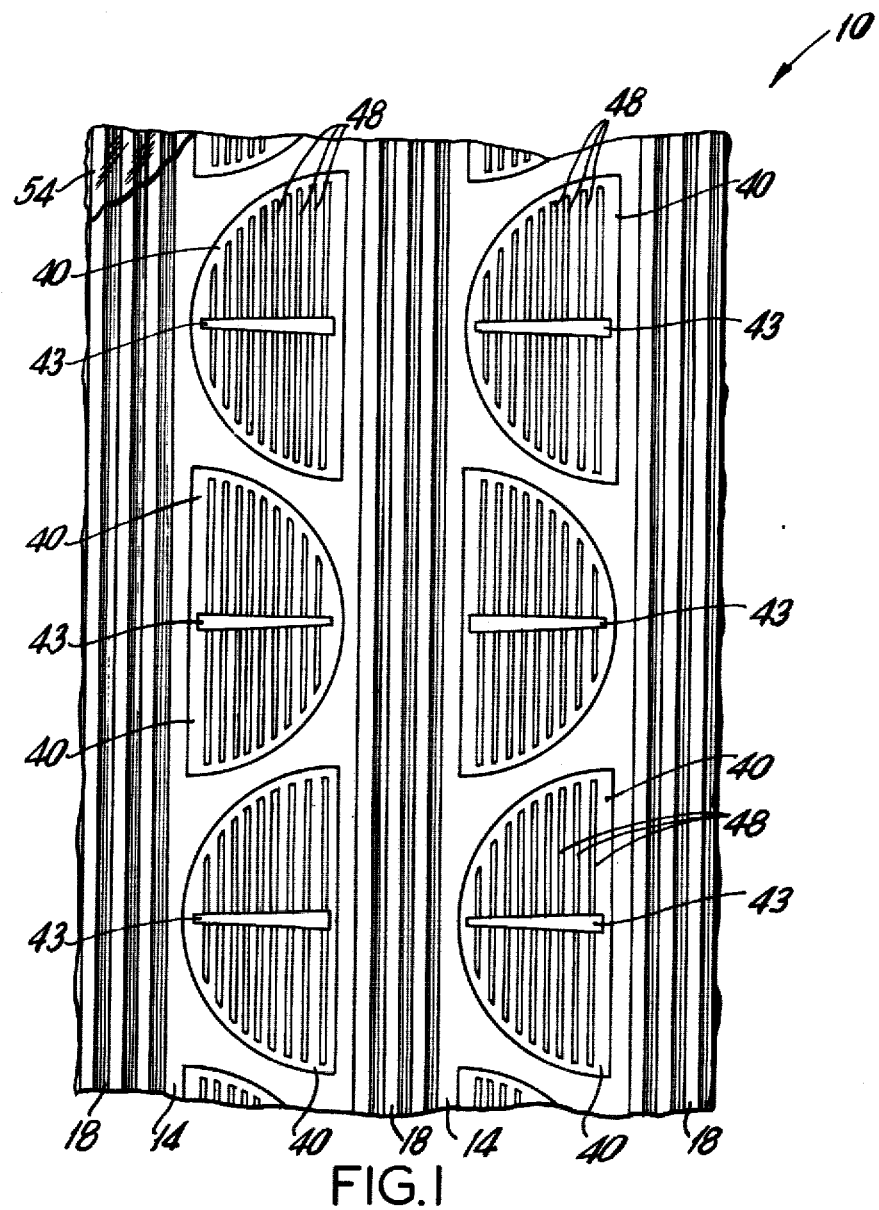
FIG. 1 is a fragmentary top plan view of a plurality of semicircular solar cells arrayed on a support structure in accordance with the subject invention.

In the embodiment shown in FIG. 1, there is a support structure 10 which is formed from an electrically nonconductive material such as a high density, high strength plastic. Generally, support structure 10 will be rectangular in shape, although other shapes may be employed. Typically, dimensions for support structure 10 are 46 inches long by 15 inches wide by 2 inches deep.

Arrayed on the top surface of support structure 10 are a plurality of semicircular solar cells 40 having top bus bars 43 which are connected to electrically conductive fingers 48 on the surface of the cell. As well known, these solar cells can be interconnected in series and/or parallel arrangements by means of flexible interconnectors (not shown) and the arrayed cells are ultimately tied into termination posts (also not shown).

In the embodiment shown in FIG. 1, the support structure has linear depressions or channels 14 of sufficient width and length to accept the linear array of solar cells 40. Also as is shown in FIG. 1, the cells are arrayed so as to cover as much of the surface of the linear depression or channel as is practical. In this regard, linear ribbon cells would optimize that coverage; however, economic considerations at this time dictate use of semicircular cells.

According to the present invention, on each side of the linear array of solar cells is a linear land area 18. The linear land area is provided with facets of light reflective surfaces for reflecting light which normally impinges on the land area at an angle such that the reflected radiation, when it reaches the front surface of the optical medium covering the solar cell array, will be totally internally reflected back down to the back surface of the array. Thus, it is particularly important in the practice of the present invention that the solar cell array mounted on the support structure be coupled with an optically transparent cover material. In other words, there should be no air spaces between the solar cells and the optical medium or between the land areas and the optical medium. Typically, the optically transparent cover material will have an index of refraction generally between about 1.3 to about 3.0 and will be in the range of about $\frac{1}{8}$ inch up to about $\frac{3}{4}$ inch thick and preferably greater than about $\frac{1}{4}$ inch thick. Such an optically transparent cover material is shown as numeral 54 for example in FIG. 2.

The optically transparent cover material employed in the practice of the present invention, for example, may be any one of the silicone rubber encapsulating materials generally known to the electronics and solar cell industry or other ultra-violet stable and weather resistant plastics such as polycarbonates (Lexan), acrylics and urethanes, or a combination of one or more of the aforesaid polymer materials and glass.

Figure 2:
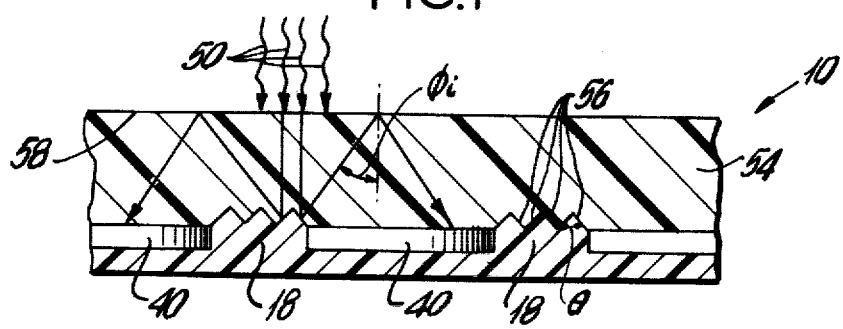
FIG. 2 is a fragmentary diagrammatic end elevation illustrating one embodiment of the present invention.

Referring still to FIG. 2, solar cells 40 are arrayed and mounted on support structure 10 and then covered by and coupled with an optically transparent layer 54. The land areas 18 between the solar cells 40 arrayed on the surface of the support structure 10 have facets having light reflective surfaces 56. The light reflective surfaces 56 may be mirrored surfaces, polished metal and the like. Forming such surfaces is well known and is not part of the subject invention.

Figure 3:
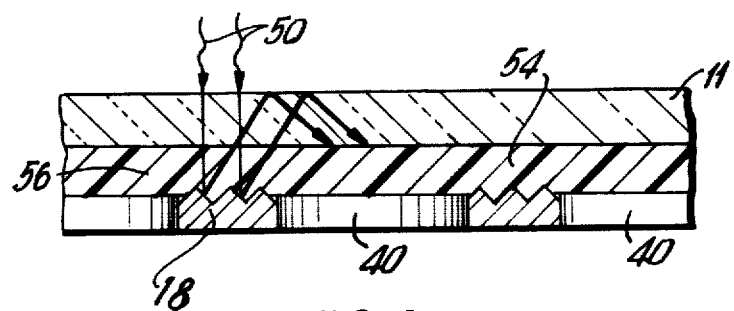
FIG. 3 is a fragmentary diagrammatic end elevation illustrating another embodiment of the present invention.

Referring now to the alternative embodiment of the present invention shown in FIG. 3, the semicircular solar cells 40 are supported by a rigid, planar, light transparent top support structure 11 which is formed from an electrically nonconductive material such as glass. A plurality of facets with light reflecting surfaces 56 are arranged in the land areas 18 between the solar cells 40. An optical medium 54 such as silicone encapsulant bonds the facets and cells to the support 11 as well as assures that there is no air space between the cells and the primary optical medium 11 or the facets and the primary optical medium 11.

As is shown in FIGS. 2 and 3, the facets preferably are in the form of V-shaped grooves. The depths of the grooves will generally be in the range of about 0.001" to 0.025" or approximately 0.1 of the thickness of the optically transparent cover material. The angle $\theta$ at the vertex formed by two upwardly sloping planes of the facets or grooves must be in the range of about 110° to 130° and preferably at an angle of 120°.

As is shown in FIGS. 2 and 3, the faceted region 18 is substantially coplanar with solar cells 40. Preferably the vertical height of the facet will be equal to the thickness of a solar cell and the facets will be arranged so that the facet will not extend below the bottom surface of the cell.

As can be seen in FIG. 2, normal vertically incident solar radiation designated, for example, generally by reference numeral 50 which impinges on normally inactive land areas 18 will be reflected by the reflecting surfaces 56 of the facets provided in the land area 18 so that the radiation re-enters the optical medium 54. When the reflected radiation reaches the front surface 58 of the optical medium, and it it makes an angle $\phi_i$, greater than the critical angle, the radiation will be totally trapped and reflected down to the back surface. The critical angle, of course, refers to the largest value which the angle of incidence may have for a ray of light passing from a more dense medium to a less dense medium. If the angle of incidence ($\phi_i$ in FIG. 2) exceeds the critical angle, the ray of light will not enter the less dense medium but will be totally internally reflected back into the denser medium.

The solar radiation which is internally reflected downwardly to the back surface on arrival can, of course, strike a solar cell rather than the land region, in which event it will be absorbed and contribute to the electric output of the module. This ability to redirect light striking inactive surfaces so that it will fall on active surfaces permits arraying of the cells at greater distances with minimum loss in output per unit area, hence raising the efficiency and/or lowering the cost per watt for a solar cell module.

Significantly, the geometry of the facets should be such that light reflected from surfaces 56 of the facets in land area 18 is not shadowed or blocked by an adjacent facet. Additionally, light upon being reflected from surfaces 56 in land area 18 when it reaches the front surface 58 of the optical medium 54 must make an angle exceeding the critical angle with said front surface 58. Thus, the angle at the apex of the vertex of the groove desirably is in the range of 110° to 130° and preferably 120°. Also, it is preferred that the depth of the groove be about 0.3 millimeters.

As indicated, the surfaces 56 of the grooves on land area 18 can be smooth optically reflecting surfaces, i.e. they should have a solar absorptance less than 0.15. These surfaces can be prepared by coating machined or molded grooves with a suitable metal such as aluminum or silver, for example.

In the practice of the present invention, the linear faceted land area optionally will have a width such that reflected light will be redirected only to the adjacent linear arrayed row of semicircular solar cells. Indeed, it also is desirable that the facets comprise V-shaped grooves running the length of the linear land area 18 so that if the module, when positioned to receive incident solar radiation, is so positioned that the V-grooves run in an east-west direction. Notwithstanding the normal 45° variation of the sun on the azimuth during the course of a year, being able to position the V-grooves to run in an east-west direction assures that the redirected light will always be directed toward the linear area containing the solar cell.

Figures 4, 5:
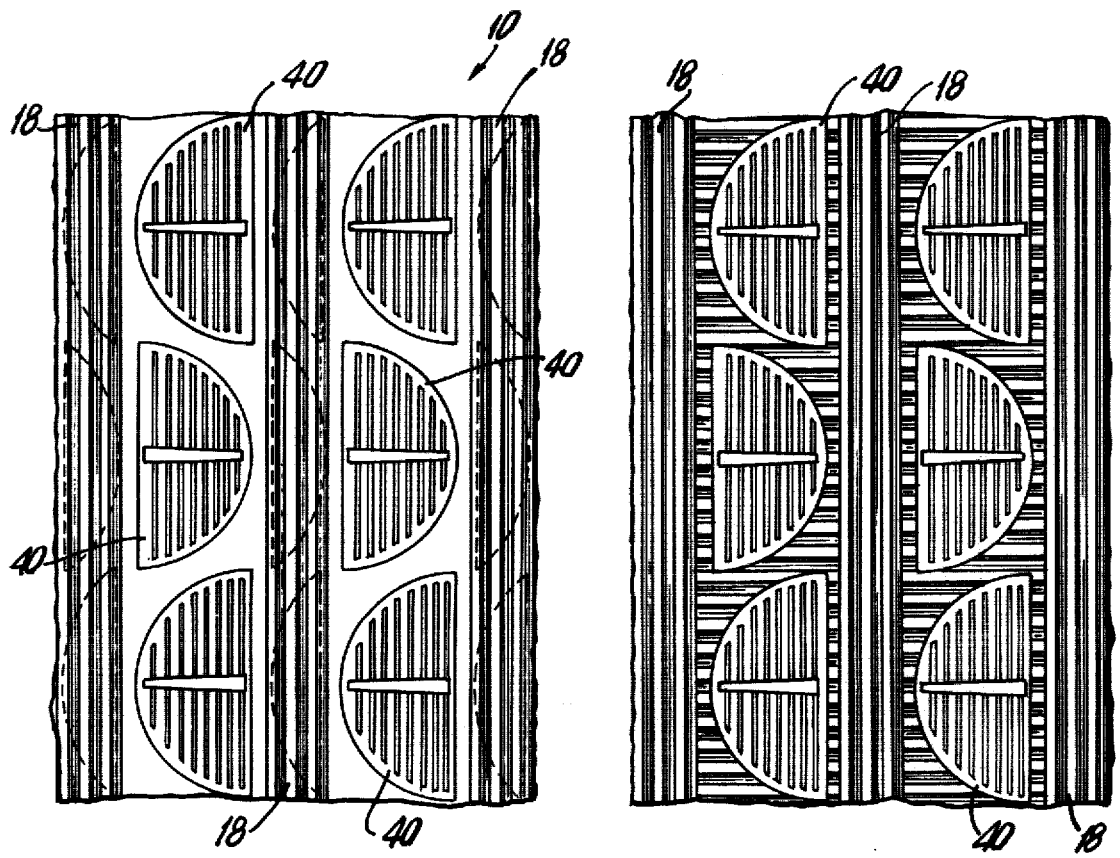
FIG. 4 is a diagrammatic illlustration of a preferred arrangement of solar cells in accordance with this invention.
FIG. 5 is a fragmentary diagrammatic top plan illustration of an alternate embodiment of this invention.

In FIG. 4, there is shown diagrammatically a particularly preferred arrangement of solar cells which provides for significant panel efficiency by translation of light from the inactive land areas onto the adjacent cell. As is shown in FIG. 4, the cells 40 are arranged so as to provide for the maximum packing possible in a linear array of semicircular cells. The light striking the reflective surfaces of the facets in land area 18 is translated or redirected so as to fall on or strike an active cell 40. FIG. 4 shows, by dotted lines, the area from which incident light will be redirected.

As is shown in FIG. 5, optionally, the areas 12 between and around the linearly arrayed semicircular cells also can be provided with facets having light-reflective surfaces. Preferably these facets will comprise V-shaped grooves which are perpendicular to the lengthwise axis of the linear arrayed solar cells.

The following demonstration illustrates the type of improvement achievable in the practice of the present invention.

First, a single semicircular solar cell was operationally mounted on a support structure in which there was provided two parallel faceted areas, approximately 7/8 of an inch wide, on adjacent sides of the semicircular cell. The faceted areas ran lengthwise substantially as shown in conjunction with a plurality of cells in FIG. 4. These faceted areas had a light reflecting metallized surface. A light transparent silicone encapsulant covered the faceted area and served to optionally couple the cell to a sheet of Sunadex glass placed on top of the assembly. Thus the silicone encapsulant and glass served as the optical medium.

In a similar manner a second assembly was made using a circular solar cell, a Sunadex glass cover, and a silicone encapsulant, but in this second assembly the solar cell was surrounded by trapezoidal segments, in hexagonal fashion, of a V-grooved reflective surface, as shown, for example, in FIG. 6 of copending U.S. Pat. No. 4,235,643, which patent is incorporated herein by reference.

Next, these cells were mounted on a board on the roof of a building in Linden, New Jersey, and oriented so that the light incident surface was normal to the sun's position at noon daylight savings time, and so the facets in the first assembly were running in an east to west direction. The second assembly was mounted so that the facets of two of the trapezoidal segments were running in an east to west direction. Then the output of each assembly was monitored over the course of a day. The data generated showed that in each instance the output of the cell was greatest at noon and that the decrease in output at times other than noon is less in the case of the first assembly made in accordance with the present invention.

What is claimed is:

1. A solar cell module comprising:
    a support structure having at least one planar surface adapted to support an array of solar cells;
    a plurality of solar cells each having a top and a bottom surface arrayed in linear strips on said support structure, said solar cells being selected from semicircular, square and ribbon solar cells;
    linear land areas between said linear arrayed solar cells;
    a light transparent optical medium optically coupling said solar cells and said land areas;
    a plurality of V-shaped grooves on said linear land areas with light reflective surfaces thereon, said grooves extending linearly and for the length of said linear strips of cells, whereby said module can be positioned in use with said grooves running in an east-west direction, each groove having a predetermined angular relationship with respect to the planar surface of said support and each other so that light impinging on said reflective surfaces of said groove is reflected upwards through said optical medium and forms an angle at the top surface thereof which is greater than the critical angle whereby said reflected light is internally reflected downwardly toward said solar cells.

2. The module of claim 1 wherein said optical medium has an index of refraction of between 1.3 and 3.0.

3. The module of claim 2 wherein the angle at the vertex of the upwardly extending sides of two adjacent grooves is between 110° and 130°.

4. The module of claim 3 wherein said angle is 120°.

5. The module of claim 4 wherein said cells are semicircular.

6. The module of claim 5 wherein said semicircular cells are arranged to provide for maximum packing of said cells in linear fashion.

7. The module of claim 6 wherein the linear land areas are of a width sufficient so that light reflected from the facets therein will be internally reflected by the optical medium only onto the adjacent areas of the support structure wherein the semicircular solar cells are linearly arrayed.

8. The module of claim 7 wherein said support structure is an electrically nonconductive material and said solar cells are mounted on said support.

9. The module of claim 8 wherein said support structure is a rigid light transparent optical material and said cells are arrayed under said structure and wherein a second optical medium is provided which together with said transparent medium optically couples said cells and said facets.

10. The module of claim 9 wherein the surfaces between adjacent cells in each linearly arrayed strip of solar cells includes V-shaped grooves having reflective surfaces thereon and which grooves are perpendicular with respect to the grooves in said linear land area.

11. A method of enhancing the output over the course of a day of lineary arrayed solar cells mounted on a support structure and encapsulated in a light transparent medium comprising:
providing light reflecting V-shaped grooves adjacent the linearly arrayed solar cells;
optically coupling said grooves to said cells;
orienting said cells to be normal to the sun at solar noon and with the grooves running in an east to west direction.

* * * * *